United States Patent
Saha et al.

(10) Patent No.: US 11,050,414 B1
(45) Date of Patent: Jun. 29, 2021

(54) DYNAMIC SINGLE INPUT-DUAL OUTPUT LATCH

(71) Applicant: GLOBALFOUNDRIES U.S. Inc., Malta, NY (US)

(72) Inventors: Uttam Saha, San Jose, CA (US); Mahbub Rashed, Cupertino, CA (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 16/881,053

(22) Filed: May 22, 2020

(51) Int. Cl.
*H03K 3/037* (2006.01)
*H03K 19/20* (2006.01)

(52) U.S. Cl.
CPC ............. *H03K 3/037* (2013.01); *H03K 19/20* (2013.01)

(58) Field of Classification Search
CPC ............................... H03K 3/037; H03K 19/20
USPC .................................. 327/199, 201, 202, 225
See application file for complete search history.

(56) References Cited

U.S. PATENT DOCUMENTS

| | | | |
|---|---|---|---|
| 3,588,546 A | 6/1971 | Lagemann | |
| 5,760,610 A | 6/1998 | Naffziger | |
| 6,081,136 A | 6/2000 | Khanna et al. | |
| 6,310,499 B1 | 10/2001 | Radjassamy | |
| 6,323,710 B1 | 11/2001 | Piguet et al. | |
| 6,603,333 B2 | 8/2003 | Vinh et al. | |
| 6,791,361 B2 | 9/2004 | Alon et al. | |
| 6,960,941 B2 | 11/2005 | Cantin et al. | |
| 7,282,957 B2 | 10/2007 | Sumita | |
| 7,710,155 B2 | 5/2010 | Bhatia et al. | |
| 9,160,317 B2 * | 10/2015 | Singh ............... | H03K 3/356121 |
| 9,461,633 B1 | 10/2016 | Foroudi | |
| 9,742,382 B2 | 8/2017 | Cai et al. | |
| 2004/0263229 A1 | 12/2004 | Minzoni | |
| 2006/0022717 A1 | 2/2006 | Park | |
| 2008/0130396 A1 | 6/2008 | Gomm et al. | |
| 2008/0258775 A1 | 10/2008 | Wendell | |
| 2008/0258788 A1 * | 10/2008 | Bhatia ............... | H03K 3/356121 327/201 |
| 2014/0266364 A1 | 9/2014 | Singh et al. | |

* cited by examiner

*Primary Examiner* — John W Poos
(74) *Attorney, Agent, or Firm* — Gibb & Riley, LLC; David A. Cain, Esq.

(57) ABSTRACT

A dynamic single input-dual output latch includes input, feedback, and output stages. In the input stage, operations are dependent on a clock signal (CLK) and a feedback signal (FB) from the feedback stage. For example, when FB is at a low voltage level and CLK switches to a high voltage level, the input stage enters a data capture mode. Once data has been captured, FB switches back to the high voltage level, placing the input stage in a data hold mode. In the output stage, operations are dependent on CLK but independent of FB. For example, instead of initiating output signal stabilization only after both CLK and FB are at high voltage levels, weak pull-down transistors (including at least one CLK-controlled pull-down transistor) are employed in the output stage to ensure output signal stabilization is initiated after data capture has begun but before FB switches to the high voltage level.

20 Claims, 4 Drawing Sheets

DYNAMIC SINGLE INPUT-DUAL OUTPUT LATCH

BACKGROUND

Field of the Invention

The present invention relates to latch structures and, more particularly, to embodiments of a dynamic single input-dual output latch.

Description of Related Art

Latches are commonly used in digital electronics and, particularly, in system-on-chip (SOC) designs. A dynamic single input-dual output latch refers to a latch that receives a single data input signal (D) and, when a clock signal (CLK) switches from a low voltage level to high voltage level, captures the logic state of D and outputs a first output signal (Q), which indicates the captured logic state of D, and a second output signal (QN), which is inverted with respect to Q. Currently available dynamic single input-dual output latches are suitable for use in older SOC designs. However, next generation SOC designs require better performing latches (e.g., latches with reduced delay between CLK switching and stabilization of the output signals Q and QN) and/or smaller latches.

SUMMARY

In view of the foregoing, disclosed herein are embodiments of a dynamic single input-dual output latch configured for improved performance and, particularly, configured for reduced delay between clock signal (CLK) switching and stabilization of the output signals. The latch embodiments include an input stage, a feedback stage, and an output stage. In the input stage, reset, data capture and data hold modes of operation are dependent on both CLK and a feedback signal (FB) from the feedback stage. For example, when FB is at a low voltage level and CLK switches to a high voltage level, the input stage enters a data capture mode. Once data is captured, FB switches back to the high voltage level, thereby placing the input stage in a data hold mode. In the output stage, standby and output signal stabilization modes of operations are dependent on CLK but independent of FB. For example, instead of initiating output signal stabilization only after FB switches to the high voltage level (i.e., at the same time the input stage enters the data hold mode), relatively weak pull-down transistors (including at least one CLK-controlled pull-down transistor) are employed in the output stage to ensure that output signal stabilization is initiated at some point in time after data capture has begun in the input stage but before FB switches to the high voltage level. Thus, the time between switching of CLK to the high voltage level and stabilization of the output signals will be reduced.

More specifically, disclosed herein are embodiments of a dynamic single input-dual output latch. The latch can include an input stage, a feedback stage and an output stage. The input stage can include two first transistor chains. Each first transistor chain can include: a first pull-up transistor; first pull-down transistors; and a data capture node at a junction between the first pull-up transistor and the first pull-down transistors. The feedback stage can include a logic gate. The logic gate can be connected to the data capture nodes of the first transistor chains, respectively and can generate and output a feedback signal (FB). The output stage can include output signal paths connected to the capture nodes, respectively. The output stage can further include second transistor chains. Each second transistor chain can include: a second pull-up transistor; second pull-down transistors; and a hold node at a junction between the second pull-up transistor and the second pull-down transistors. The second transistor chains can be cross-coupled between the output signal paths. Reset, data capture and data hold modes of operation in the input stage are dependent on a clock signal (CLK) (e.g., from a clock signal generator) and on FB, whereas standby and output signal stabilization modes of operation in the output stage are dependent on CLK but not FB. That is, operation of the output stage is independent of FB.

As discussed further in the detailed description section below, delay between CLK switching to the high voltage state and initiation of output signal stabilization in the output stage is necessary in order to allow the data to be accurately captured. In conventional dynamic single input-dual output latches this delay is controlled in the output stage by FB. In the latch embodiments disclosed herein this delay is instead controlled by selectively tuning the current flow rate through the second pull-down transistors in each second transistor chain relative to the current flow rate of the first pull-up transistors in each first transistor chain.

Specifically, in the input stage, when FB is at a high voltage level and CLK switches to a low voltage level, the input stage can enter a reset mode causing the data capture nodes to be pre-charged to a high voltage level. When the data capture nodes are both at the high voltage level, the logic gate can cause FB to switch to the low voltage level. When FB is at the low voltage level and CLK switches to a high voltage level, the input stage can enter a data capture mode during which one of the previously pre-charged data capture nodes will be discharged to ground given the current logic state of a data input signal. Thus, the data capture nodes will be at different voltage levels and, particularly, opposite voltage levels with one being high and one being low and with the order being indicative of the capture data value. Once the data is captured, the logic gate can cause FB to switch back to the high voltage level, thereby placing the input stage in a data hold mode during.

In the output stage, the output signal paths are connected to the data capture nodes. When in the standby mode, the second transistor chains are in an off-state and the output stage has no impact in the output signals. When in the output signal stabilization mode, the second transistor chains are in an on-state and the output stage maintains the opposite voltage levels on the output signal paths. However, instead of initiating output signal stabilization by switching the second transistor chains to the on-state only after FB switches to the high voltage level (i.e., at the same time the input stage enters the data hold mode), the latch disclosed herein is configured so that the first current flow rate through the first pull-down transistors in either first transistor chain in the input stage will be greater than the second current flow rate through the second pull-down transistors (including at least one CLK-controlled second pull-down transistor) in each second transistor chain in the output stage. As a result, output signal stabilization is initiated at some point in time after data capture in the input stage has been initiated in response to CLK switching to the high voltage level. This point in time can be before FB subsequently switches to the high voltage level. Thus, in the disclosed latch the delay between CLK switching to the high voltage state and stabilization of the output signals can be reduced and latch performance can be improved.

The second current flow rate can be reduced relative to the first current flow rate by varying the pull-down transistor sizes and/or the pull-down transistor numbers between the first and second transistor chains.

For example, in one embodiment, the first transistor chains and the second transistor chains can each have the same number of pull-down transistors. The first pull-down transistors in each first transistor chain can each have a first channel width and the second pull-down transistors in each second transistor can each have a second channel width that is less than the first channel width. Thus, the second pull-up transistors will be weaker than the first pull-up transistors. More specifically, in this configuration, due to the different channel widths, when FB is at the low voltage level and the CLK switches to the high voltage level, a first current flow rate through the first pull-down transistors in a data-dependent one of the first transistor chains in the input stage will be faster than a second current flow rate through the second pull-down transistors in a data-dependent one of the second transistor chains in the output stage so that transition of the output stage from the standby mode to the output signal stabilization mode is delayed until after one of the data capture node begins discharging.

In another embodiment, the first transistor chains can each have a first number of CLK-controlled pull-down transistors and the second transistor chains can each have a second number of CLK-controlled pull-down transistors that is greater than the first number. Thus, the second pull-up transistors will be weaker than the first pull-up transistors. More specifically, even though CLK is concurrently applied to the gates of the CLK-controlled pull-down transistors in the first transistor chains and the second transistor chains, the pull-down transistors in a given chain will turn on in sequence and not concurrently (as discussed further in the detailed description section). Since the first transistor chains have a lesser number of CLK-controlled pull-down transistors, when FB is at the low voltage level and the CLK switches to the high voltage level, a first current flow rate through the first pull-down transistors in a data-dependent one of the first transistor chains in the input stage will be faster than a second current flow rate through the second pull-down transistors in a data-dependent one of the second transistor chains in the output stage so that transition of the output stage from the standby mode to the output signal stabilization mode is delayed until after one of the data capture node begins discharging.

In yet another embodiment, a combination of different channel widths and different numbers of CLK-controlled pull-down transistors in the first and second transistor chains could be employed.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, latches are commonly used in digital electronics and, particularly, in system-on-chip (SOC) designs. A dynamic single input-dual output latch refers to a latch that receives a single data input signal (D) and, when a clock signal (CLK) switches from a low voltage level to high voltage level, captures the logic state of D and outputs a first output signal (Q), which indicates the captured logic state of D, and a second output signal (QN), which is inverted with respect to Q. Currently available dynamic single input-dual output latches are suitable for use in older SOC designs. However, next generation SOC designs require better performing latches (e.g., latches with reduced delay between CLK switching and stabilization of the output signals Q and QN) and/or smaller latches.

Figure 1:
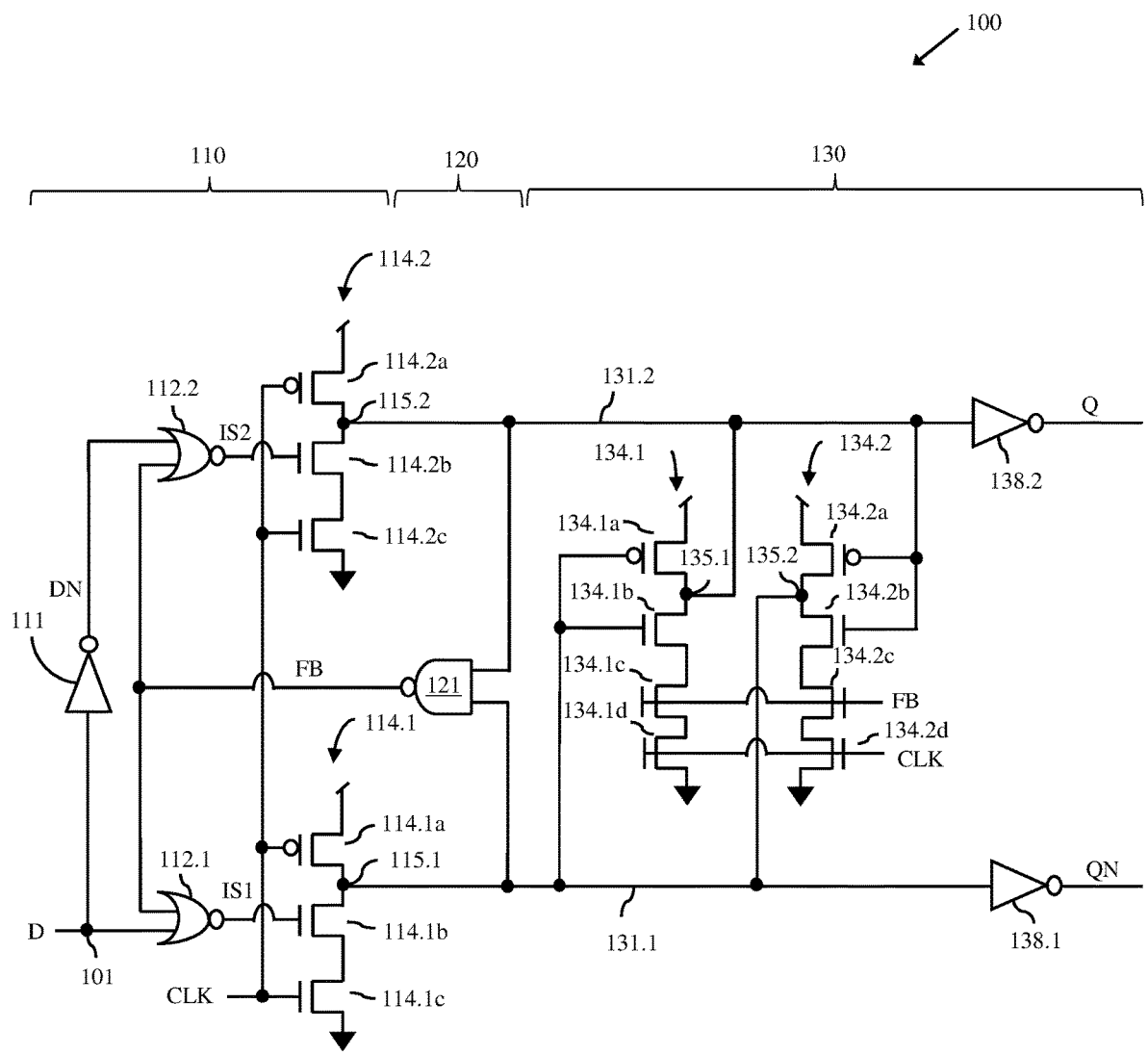
FIG. 1 is a schematic diagram illustrating a prior art dynamic single input-dual output latch.

For example, FIG. 1 is a schematic diagram illustrating an exemplary dynamic single input-dual output latch 100. The latch 100 includes an input stage 110, a feedback stage 120, and an output stage 130. In this latch 100, reset, data capture and data hold modes of operation in the input stage 110 and standby and output signal stabilization modes of operation in the output stage 130 are both clock signal (CLK)-dependent and feedback signal (FB)-dependent.

The input stage 110 can include two first transistor chains 114.1 and 114.2, a data input node 101, an inverter 111 and two NOR gates (i.e., a first NOR gate 112.1 and a second NOR gate 112.2). Each first transistor chain 114.1, 114.2 can include: a first pull-up transistor (e.g., a PFET) 114.1a, 114.2a; multiple first pull-down transistors (e.g., NFETs) 114.1b-c, 114.2b-c; and a data capture node 115.1, 115.2 at the junction between the first pull-up transistor 114.1a, 114.2a and the first pull-down transistors 114.1b-c, 114.2b-c. A clock signal (CLK) (e.g., from a clock signal generator (not shown)) can be applied to the gates of the first pull-up transistor 114.1a, 114.2a and the distal first pull-down transistor 114.1c, 114.2c. The data input node 101 can receive a data input signal (D). The first NOR gate 112.1 can receive two input signals including D and a feedback signal (FB) from the feedback stage 120 (as discussed in greater detail below). Based on these input signals, the first NOR gate 112.1 can generate and output a first intermediate signal (IS1) according to a conventional NOR truth table. IS1 can be applied to the gate of the proximal first pull-down transistor 114.1b in the first transistor chain 114.1. The inverter 111 can receive D and can generate and output an inverted data input signal (DN). The second NOR gate 112.2 can receive two input signals including DN and FB. Based on these input signals, the second NOR gate 112.2 can generate and output a second intermediate signal (IS2) according to the conventional NOR truth table. IS2 can be applied to the gate of the proximal first pull-down transistor in a second one of the first transistor chains (i.e., to the proximal second pull-down transistor 114.2b in the first transistor chain 114.2). As a result, the voltage level on the data capture node 115.1 within the first transistor chain 114.1 will depend on CLK and IS1 (which, in turn, will depend upon D and FB). Furthermore, the voltage level on the data capture node 115.2 within the first transistor chain 114.2 will depend on CLK and IS2 (which, in turn, will depend upon DN and FB).

The feedback stage 120 can include a logic gate and, particularly, a NAND gate 121. The NAND gate 121 can receive two input signals from the data capture nodes 115.1 and 115.2 within the first transistor chains 114.1 and 114.2, respectively. Based on the voltage levels (i.e., logic states) on the data capture nodes 115.1 and 115.2, this NAND gate 121 can generate and output FB according to a conventional NAND truth table. As mentioned above, FB can be output to the NOR gates 112.1 and 112.2 in the input stage 110.

Depending upon the voltage levels (i.e., logic states) of CLK and FB, the input stage 110 can operate in one of three different operating modes and, particularly, in a reset mode, a data capture mode or a data hold mode.

Specifically, when FB is at a high voltage level and the CLK switches to a low voltage level, the input stage 110 can enter the reset mode during which the data capture nodes 115.1, 115.2 are pre-charged to the high voltage level. That is, when FB is at the high voltage level, IS1 and IS2 output from the NOR gates 112.1 and 112.2 will both be at low voltage levels, thereby turning off the proximal first pull-down transistors 114.1*b* and 114.2*b* in each first transistor chain 114.1, 114.2. When CLK then switches to the low voltage level, the distal first pull-down transistors 114.1*c* and 114.2*c* will turn off and the first pull-up transistors 114.1*a* and 114.2*a* will turn on. As a result, the voltage levels on the data capture nodes 115.1 and 115.2 in the two first transistor chains 114.1 and 114.2 will be pulled up (i.e., the data capture nodes 115.1 and 115.2 will both be pre-charged). Once the data capture nodes 115.1 and 115.2 are pre-charged to the high voltage level (i.e., to logic "1"), the NAND gate 121 in the feedback stage 120 will switch FB back to the low voltage level.

When FB is at the low voltage level and CLK subsequently switches to the high voltage level, the input stage 110 enters the data capture mode to capture the current logic state of D. That is, when FB is at the low voltage level and CLK switches to the high voltage level, one of the data capture nodes (i.e., either data capture node 115.1 or data capture node 115.2) will be discharged to the low voltage level depending upon current logic state of D so that the data capture nodes 115.1 and 115.2 are at different voltage levels (i.e., opposite voltage levels). For example, if D is at a low voltage level (i.e., at logic "0") when FB is at the low voltage level and CLK switches to the high voltage level, then IS1 output from the first NOR gate 112.1 will be at a high voltage level (i.e., at logic "1"), thereby causing the first proximal pull-down transistor 114.1*b* to turn on, and IS2 output from the second NOR gate 112.2 will be at a low voltage level (i.e., at logic "0"), thereby ensuring that the first proximal transistor 114.2*b* remains turned off. As a result, the data capture node 115.1 will be discharged to the low voltage level and the data capture node 115.2 will remain at the high voltage level. Alternatively, if D is at a high voltage level (i.e., at logic "1") when FB is at the low voltage level and CLK switches to the high voltage level, then IS1 output from the first NOR gate 112.1 will be at a low voltage level (i.e., at logic "0"), thereby ensuring that the first proximal pull-down transistor 114.1*b* remains turned off and IS2 output from the second NOR gate 112.2 will be at a high voltage level (i.e., at logic "1"), thereby causing the first proximal transistor 114.2*b* to be turned on. As a result, the data capture node 115.2 will be discharged to the low voltage level and the data capture node 115.1 will remain at the high voltage level. Thus, the data value of D is indicated by whichever data capture node is discharged.

Once the data capture nodes 115.1 and 115.2 are at different voltage levels (i.e., indicating the data value of D), the NAND gate 121 will switch FB back to the high voltage level and the input stage 110 enters the data hold mode to prevent any further switching of the voltage levels on the data capture nodes 115.1 and 115.2. Specifically, once FB switches to the high voltage level, the outputs of the NOR gates 112.1 and 112.2 (i.e., IS1 and IS2) will both be low, thereby turning off the proximal first pull-down transistors 114.1*b* and 114.2*b* in both of the first transistor chains 114.1 and 114.2.

When the CLK signal subsequently switches back to the low voltage level, the input stage 110 will again enter the reset mode (as discussed above).

Meanwhile, depending upon the voltage levels (i.e., logic states) of CLK and FB, the output stage 130 can in a standby mode or an output signal stabilization mode.

Specifically, the output stage 130 can include: two output signal paths 131.1 and 131.2, each with a first end and a second end opposite the first end. The first end of each output signal path 131.1, 131.2 can be electrically connected to a corresponding one of the data capture nodes 115.1, 115.2 in the first transistor chains 114.1, 114.2 of the input stage 110. The output stage 130 can further include two inverters 138.1, 138.2. The second end of each output signal path 131.1, 131.2 can be electrically connected to a corresponding one of the inverters 138.1, 138.2. Thus, output signals QN, Q from the inverters 138.1, 138.2 will be inverted with respect to signals on the data capture nodes 115.1, 115.2.

The output stage 130 can further include two second transistor chains 134.1 and 134.2. Each second transistor chain 134.1, 134.2 can include: a second pull-up transistor (e.g., a PFET) 134.1*a*, 134.2*a*; three second pull-down transistors (e.g., NFETs) including a proximal second pull-down transistor 134.1*b*, 134.2*b*, a center second pull-down transistor 134.1*c*, 134.2*c* and a distal second pull-down transistor 134.1*d*, 134.2*d*; and a data hold node 135.1, 135.2 at the junction between the second pull-up transistor 134.1*a*, 134.2*a* and the second pull-down transistors 134.1*b-d*, 134.2*b-d*. The second transistor chains 134.1, 134.2 can be cross-coupled between the output signal paths 131.1, 131.2. That is, in the second transistor chain 134.1, the gates of the second pull-up transistor 134.1*a* and the proximal second pull-down transistor 134.1*b* can be electrically connected to the output signal path 131.1 and the data hold node 135.1 can be electrically connected to the output signal path 131.2. In the second transistor chain 134.2, the gates of the second pull-up transistor 134.2*a* and the proximal second pull-down transistor 134.2*b* can be electrically connected to the output signal path 131.2 and the data hold node 135.2 can be electrically connected to the output signal path 131.1. In each second transistor chain 134.1, 134.2, the gates of the center and distal second pull-down transistors 134.1*c-d*, 134.2*c-d* can receive FB and CLK.

When the center and distal second pull-down transistors in each second transistor chain are all turned off such that these second transistor chains 134.1, 134.2 are both in an off-state, there is no impact on the output signals Q and QN. Thus, for example, during the reset mode in the input stage 110 when the data capture nodes 115.1, 115.2 are both pre-charged to a high voltage level, the logic states of Q and QN will both be "0". However, after CLK has switched to the high voltage level and data capture causes the data capture nodes 115.1 and 115.2 to be at opposite voltage levels (indicating a captured data state), the NAND gate 121 will switch FB back to the high voltage level and the input stage 110 will enter the data hold mode to prevent further switching of the voltage levels on the data capture nodes 115.1 and 115.2. Additionally, once FB switches to the high voltage level, the center and distal second pull-down transistors in each second transistor chain will all be turned on such that the second transistor chains 134.1 and 134.2 are switched to an on-state, thereby maintaining the opposite voltage levels on the output signal paths 131.1 and 131.2, respectively (which are connected to the data capture nodes 115.1 and 115.2). That is, when CLK initially switches to the high voltage level, the distal second pull-down transistor 134.1d, 134.2d in each second transistor chains 134.1, 134.2 will be turned on. However, because switching of FB is delayed until after D has captured to the data capture nodes (i.e., until one of the two data capture nodes has been discharged), the center second pull-down transistor 134.1c, 134.2c in each second transistor chain 134.1, 134.2 remains turned off such that the second transistor chains 134.1 and 134.2 remain in the off-state and have no impact on the output signal paths. Delay between CLK switching to the high voltage state and switching the second transistor chains 134.1, 134.2 to the on-state to initiate output signal stabilization is necessary in order to allow the data to be accurately captured.

Once one of the data capture nodes is discharged (i.e., once the data value of D has been captured) and FB switches to the high voltage state, the center second pull-down transistors 134.1c, 134.2c turn on and since the distal second pull-down transistors 134.1d, 134.2d are already turned on, the second transistor chains 134.1, 134.2 will switch to the on-state. In this case, if the voltage level on the output signal path 131.1 is high (when the data input signal is at a logic "1") and the voltage level on the output signal path 131.2 is low, the second pull-up transistor 134.1a will turn off and the proximal second pull-down transistor 134.1b will turn so that the data hold node 135.1 is pulled down to keep the output signal path 131.2 at a low voltage level and Q high. Additionally, the second pull-up transistor 134.2a will turn on and the proximal second pull-down transistor 134.2b will turn off so that the data hold node 135.2 is pulled up to keep the output signal path 131.1 at a high voltage level and QN low. Contrarily, if the voltage level on the output signal path 131.1 is low (when the data input signal is at a logic "0") and the voltage level on the output signal path 131.2 is high, the second pull-up transistor 134.1a will turn on and the proximal second pull-down transistor 134.1b will remain off so that the data hold node 135.1 is pulled up to keep the output signal path 131.2 at a high voltage level. Additionally, the second pull-up transistor 134.2a will be off and the proximal second pull-up transistor 134.2b will turn so that the data hold node 135.2 is pulled down to keep the output signal path 135.1 at a low voltage level and QN high.

As mentioned above, when CLK switches back to the low voltage level, the input stage 110 enters the reset mode during which the data capture nodes 115.1, 115.2 are pre-charged to the high voltage level. In the output stage 130, CLK switching to the low voltage level turns off the distal second pull-down transistors 134.1d, 134.2d in each second transistor chain 134.1, 134.2 so that the second transistor chains enter an off-state. Otherwise, the second transistor chains would prevent such pre-charging.

Such a dynamic single input-dual output latch has been suitable for use in older SOC designs. However, next generation SOC designs require better performing latches (e.g., latches with reduced delay between CLK switching and stabilization of the dual output) and/or small latches.

In view of the foregoing, disclosed herein are embodiments of a dynamic single input-dual output latch configured for improved performance and, particularly, configured for reduced delay between clock signal (CLK) switching and stabilization of the output signals. The latch embodiments include an input stage, a feedback stage, and an output stage. In the input stage, reset, data capture and data hold modes of operations are dependent on both CLK and a feedback signal (FB) from the feedback stage. For example, when FB is at a low voltage level and CLK switches to a high voltage level, the input stage enters a data capture mode. Once data is captured, FB switches back to the high voltage level, thereby placing the input stage in a data hold mode. In the output stage, standby and output signal stabilization modes of operations are dependent on CLK but independent of FB. For example, instead of initiating output signal stabilization only after FB switches to the high voltage level (i.e., at the same time the input stage enters the data hold mode), relatively weak pull-down transistors (including at least one CLK-controlled pull-down transistor) are employed in the output stage to ensure that output signal stabilization is initiated at some point in time after data capture has begun but before FB switches to the high voltage level. Thus, the time between switching of CLK to the high voltage level and stabilization of the output signals will be reduced.

Figure 2A:
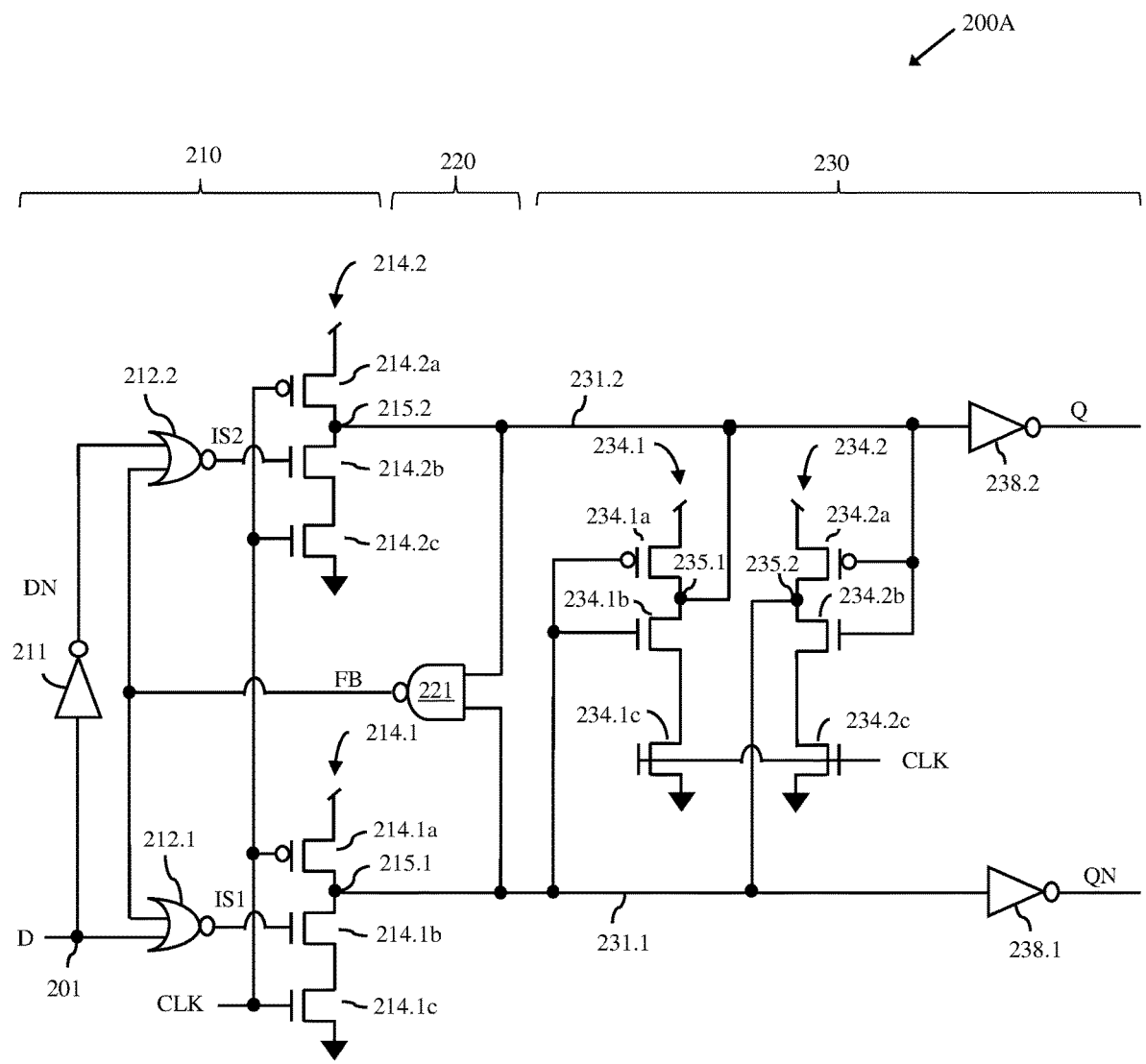
FIG. 2A is a schematic diagrams illustrating one disclosed embodiment of a dynamic single input-dual output latch.
Figure 2B:
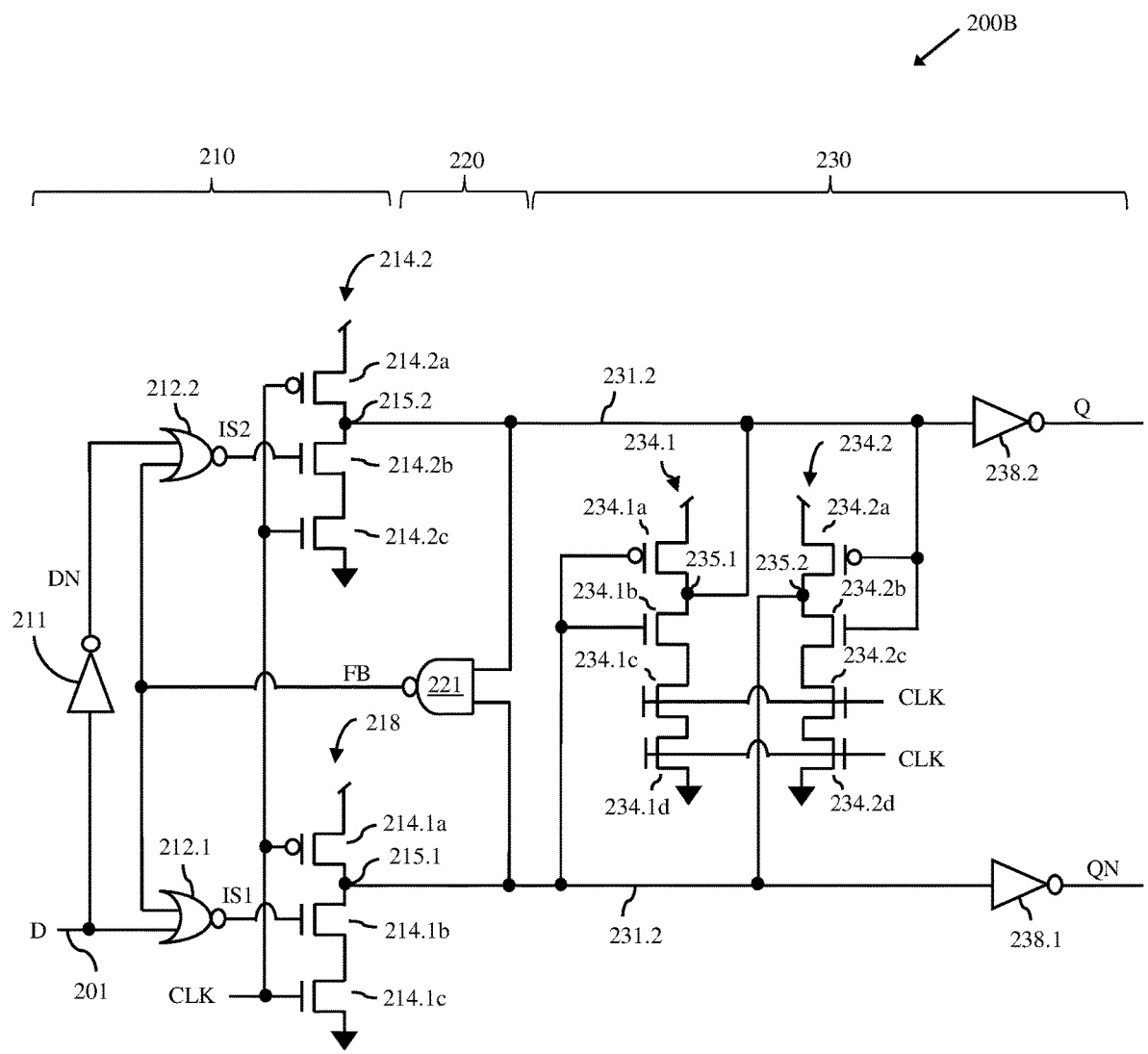
FIG. 2B is a schematic diagrams illustrating another disclosed embodiment of a dynamic single input-dual output latch.

More particularly, FIGS. 2A and 2B are schematic diagram illustrating disclosed embodiments of a dynamic single input-dual output latch 200A, 200B. The latch 200A, 200B includes an input stage 210, a feedback stage 220, and an output stage 230. In this latch 200A, 200B, reset, data capture and data hold modes of operation in the input stage 210 are dependent on a clock signal (CLK) (e.g., from a clock signal generator (not shown)) and on a feedback signal (FB) from the feedback stage 220 (as discussed below), whereas standby and output signal stabilization modes of operation in the output stage 230 are dependent on CLK but not FB. That is, operation of the output stage 230 is independent of FB.

Specifically, the input stage 210 can include two first transistor chains 214.1 and 214.2, a data input node 201, an inverter 211 and two NOR gates (i.e., a first NOR gate 212.1 and a second NOR gate 212.2).

For purposes of this disclosure, a transistor chain refers to a set of series-connected transistors. The series-connected transistors can be field effect transistors (FETs) including a combination of both P-type and N-type field effects. Each first transistor chain 214.1, 214.2 can include, for example, three series-connected transistors. These three series-connected transistors can include: a first pull-up transistor (e.g., a PFET) 214.1a, 214.2a and two first pull-down transistors (e.g., NFETs, referred to herein as a proximal first pull-down transistor 214.1b, 214.2b and a distal first pull-down transistor 214.1c, 214.2c). A data capture node 215.1, 115.2 can be located at the junction between the first pull-up transistor 214.1a, 214.2a and the proximal first pull-down transistor 214.1b, 214.2b. CLK can be applied to the gates of the first pull-up transistor 214.1a, 214.2a and the distal first pull-down transistor 214.1c, 214.2c. That is, the first pull-up transistor and the distal first pull-down transistor in each first transistor chain can be CLK-controlled.

The data input node 201 can receive a data input signal (D). The first NOR gate 212.1 can receive two input signals including D and a feedback signal (FB) from the feedback stage 220 (as discussed in greater detail below). Based on these input signals, the first NOR gate 212.1 can generate and output a first intermediate signal (IS1) according to a conventional NOR truth table. That is, IS1 will be at a high voltage level (i.e., at logic "1") when D and FB are both at low voltage levels (i.e., at logic "0"), otherwise the IS1 will be at the low voltage level (i.e., at logic "0"). IS1 can be applied to the gate of the proximal first pull-down transistor 214.1b in the first transistor chain 214.1. The inverter 211 can receive D and can generate and output an inverted data input signal (DN). The second NOR gate 212.2 can receive two input signals including DN and FB. Based on these input signals, the second NOR gate 212.2 can generate and output a second intermediate signal (IS2) according to the conventional NOR truth table discussed above. That is, IS2 will be at the high voltage level (i.e., at logic "1") when DN and FB are both at low voltage levels (i.e., at logic "0"), otherwise IS2 will be at the low voltage level (i.e., at logic "0"). IS2 can be applied to the gate of the proximal first pull-down transistor in a second one of the first transistor chains (i.e., to the proximal second pull-down transistor 114.2b in the first transistor chain 214.2). As a result, the voltage level on the data capture node 215.1 within the first transistor chain 214.1 will depend on CLK and IS1 (which, in turn, will depend upon D and FB). Furthermore, the voltage level on the data capture node 215.2 within the first transistor chains 214.2 will depend on CLK and IS2 (which, in turn, will depend upon DN and FB).

The feedback stage 220 can include a logic gate and, particularly, a NAND gate 221. The NAND gate 221 can receive two input signals from the data capture nodes 215.1 and 215.2 within the first transistor chains 214.1 and 214.2, respectively. Based on the voltage levels (i.e., logic states) on the data capture nodes 215.1 and 215.2, this NAND gate 221 can generate and output FB according to a conventional NAND truth table. That is, the FB will be at the low voltage level (i.e., at logic "0") when the voltage levels on the data capture nodes 215.1 and 215.2 are both high (i.e., at logic "1"), otherwise FB will be at the high voltage level (i.e., at logic "1"). As mentioned above, FB can be output to the NOR gates 212.1 and 212.2 in the input stage 110.

Depending upon the voltage levels (i.e., logic states) of CLK and FB, the input stage 210 can operate in one of three different operating modes and, particularly, in a reset mode, a data capture mode or a data hold mode.

Specifically, when FB is at a high voltage level and the CLK switches to a low voltage level, the input stage 210 can enter the reset mode during which the data capture nodes 215.1, 215.2 are pre-charged to the high voltage level. That is, when FB is at the high voltage level, IS1 and IS2 output from the NOR gates 212.1 and 212.2 will both be at low voltage levels, thereby turning off the proximal first pull-down transistors 214.1b and 214.2b in each first transistor chain 214.1, 214.2. When CLK then switches to the low voltage level, the distal first pull-down transistors 214.1c and 214.2c will turn off and the first pull-up transistors 214.1a and 214.2a will turn on. As a result, the voltage levels on the data capture nodes 215.1 and 215.2 in the two first transistor chains 214.1 and 214.2 will be pulled up (i.e., the data capture nodes 215.1 and 215.2 will both be pre-charged). Once the data capture nodes 215.1 and 215.2 are pre-charged to the high voltage level (i.e., to logic "1"), the NAND gate 221 in the feedback stage 220 will switch FB back to the low voltage level.

When FB is at the low voltage level and CLK subsequently switches to the high voltage level, the input stage 210 enters the data capture mode to capture the current logic state of D. That is, when FB is at the low voltage level and CLK switches to the high voltage level, one of the data capture nodes (i.e., either data capture node 215.1 or data capture node 215.2) will be discharged to the low voltage level depending upon current logic state of D so that the data capture nodes 215.1 and 215.2 are at different voltage levels (i.e., opposite voltage levels). For example, if D is at a low voltage level (i.e., at logic "0") when FB is at the low voltage level and CLK switches to the high voltage level, then IS1 output from the first NOR gate 212.1 will be at a high voltage level (i.e., at logic "1"), thereby causing the first proximal pull-down transistor 214.1b to turn on, and IS2 output from the second NOR gate 212.2 will be at a low voltage level (i.e., at logic "0"), thereby ensuring that the first proximal transistor 214.2b remains turned off. As a result, the data capture node 115.1 will be discharged to the low voltage level and the data capture node 215.2 will remain at the high voltage level. Alternatively, if D is at a high voltage level (i.e., at logic "1") when FB is at the low voltage level and CLK switches to the high voltage level, then IS1 output from the first NOR gate 212.1 will be at a low voltage level (i.e., at logic "0"), thereby ensuring that the first proximal pull-down transistor 214.1b remains turned off and IS2 output from the second NOR gate 212.2 will be at a high voltage level (i.e., at logic "1"), thereby causing the first proximal transistor 214.2b to be turned on. As a result, the data capture node 215.2 will be discharged to the low voltage level and the data capture node 215.1 will remain at the high voltage level. Thus, whichever data capture node is discharged will indicate the captured data value of D.

Once the data capture nodes 215.1 and 215.2 are at different voltage levels (i.e., once the data value of D is captured), the NAND gate 221 will switch FB back to the high voltage level and the input stage 210 enters the data hold mode to prevent any further switching of the voltage levels on the data capture nodes 215.1 and 215.2. Specifically, once FB switches to the high voltage level, the outputs of the NOR gates 212.1 and 212.2 (i.e., IS1 and IS2) will both be low, thereby turning off the proximal first pull-down transistors 214.1b and 214.2b in both of the first transistor chains 214.1 and 214.2.

When the CLK signal subsequently switches back to the low voltage level, the input stage 210 will again enter the reset mode (as discussed above).

Meanwhile, depending upon the voltage level (i.e., logic state) of CLK and independent of FB, the output stage 230 can operate in a standby mode or an output signal stabilization mode.

Specifically, the output stage 230 can include: two output signal paths 231.1 and 231.2, each with a first end and a second end opposite the first end. The first end of each output signal paths 231.1, 231.2 can be electrically connected to a corresponding one of the data capture nodes 215.1, 215.2 in the first transistor chains 214.1, 214.2 of the input stage 210. The output stage 230 can further include two inverters 238.1, 238.2. The second end of each output signal paths 231.1, 231.2 can be electrically connected to the input of a corresponding one of the inverters 238.1, 238.2. Thus, output signals QN, Q from the inverters 238.1, 238.2 will be inverted with respect to signals on the data capture nodes 215.1, 215.2.

The output stage 230 can further include two second transistor chains 234.1 and 234.2. Each second transistor chain 234.1, 234.2 can include multiple series-connected transistors. These series-connected transistors can include a second pull-up transistor (e.g., a PFET) 234.1a, 234.2a and multiple second pull-down transistors (e.g., NFETs) (e.g., see the proximal and distal second pull-down transistors 234.1b-c, 234.2b-c in the latch 200A, discussed in greater detail below; see the proximal, center, and distal second pull-down transistors 234.2b-d, 234.2b-d in the latch 200B, discussed in greater detail below). A data hold node 235.1, 235.2 can be in each second transistor chain 234.1, 234.2 at the junction between the second pull-up transistor 234.1a, 234.2a and the proximal second pull-down transistor

234.1*b*, 234.2*b*. The second transistor chains 234.1, 234.2 can be cross-coupled between the output signal paths 231.1, 231.2. That is, in the second transistor chain 234.1, the gates of the second pull-up transistor 234.1*a* and the proximal second pull-down transistor 234.1*b* can be electrically connected to the output signal path 231.1 and the data hold node 235.1 can be electrically connected to the output signal path 231.2. In the second transistor chain 234.2, the gates of the second pull-up transistor 234.2*a* and the proximal second pull-down transistor 234.2*b* can be electrically connected to the output signal path 231.2 and the data hold node 235.2 can be electrically connected to the output signal path 231.1. In both of the second transistor chains 234.1, 234.2, the gates of the remaining second pull-down transistors can receive CLK (i.e., the remaining second pull-down transistors can be CLK-controlled). That is, in the latch 200A, the gate of the distal second pull-down transistors 234.1*c*, 234.2*c* can receive CLK. In the latch 200B, the gates of the center and distal second pull-down transistors 234.2*c-d*, 234.2*c-d* can receive CLK.

Figure 3:
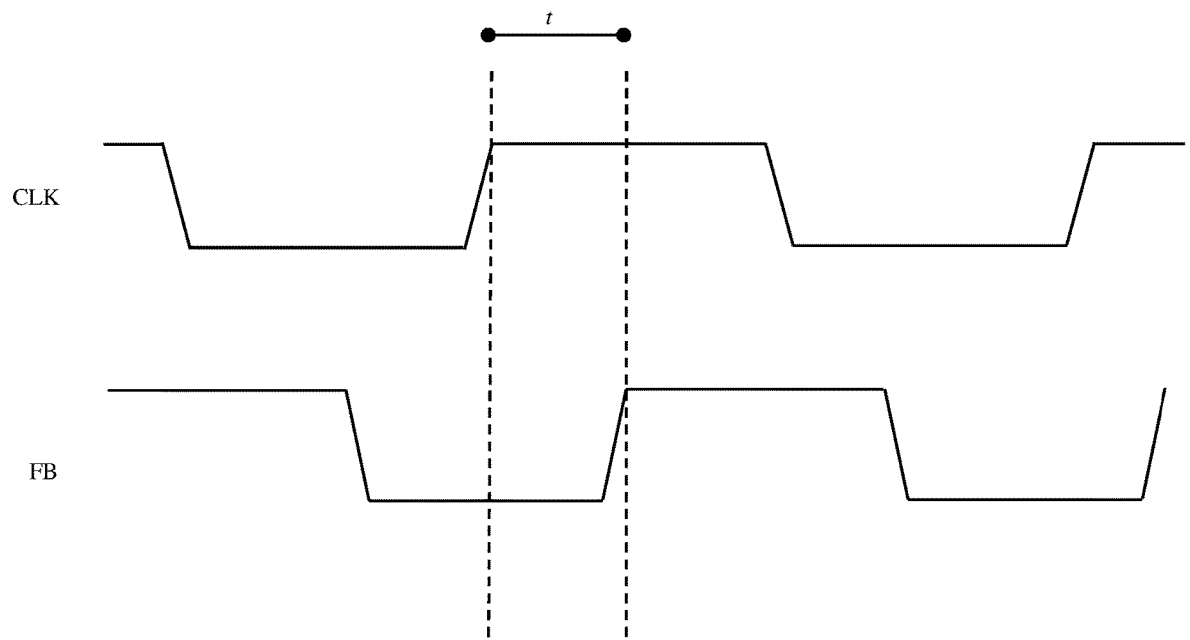
FIG. 3 is a timing diagram associated with the dynamic single input-dual output latch of FIG. 1.

It should be noted that none of the second pull-down transistors in the second transistor chains of the output stage 230 are FB-controlled. Thus, operation of this output stage 230 in a standby mode or an output signal stabilization mode is dependent on CLK but not FB. That is, operation of the output stage 230 is independent of FB. As discussed above with regard to the latch 100, delay (t) between CLK switching to the high voltage state and initiation of output signal stabilization in the output stage 130 is necessary in order to ensure that the data is accurately captured in the input stage. In the latch 100, this delay (t) is controlled in the output stage by the FB-controlled first pull-down transistors 134.1*c*, 134.2*c* so that initiation of output signal stabilization occurs only after FB switches to the high voltage level, as shown in the timing diagram of FIG. 3. In the latch 200A, 200B disclosed herein, t is instead controlled by selectively tuning the current flow rate of the second pull-down transistors (including at least one CLK-controlled second pull-down transistor) in each second transistor chain 234.1, 234.2 relative to the current flow rate of the first pull-up transistors in each first transistor chain 214.1, 214.2.

Specifically, as mentioned above, in the input stage 210, when FB is at a high voltage level and CLK switches to a low voltage level, the input stage 210 can enter the reset mode causing the data capture nodes 215.1, 215.2 to be pre-charged to a high voltage level. When the data capture nodes 215.1, 215.2 are both at the high voltage level, the NAND gate 221 in the feedback stage 220 can cause FB to switch to the low voltage level. When FB is at the low voltage level and CLK switches to a high voltage level, the input stage 210 can enter the data capture mode during which one of the previously pre-charged data capture nodes will be discharged to ground given the current logic state of D. Thus, the data capture nodes 215.1, 215.2 will be a different voltage levels (i.e., opposite voltage levels with one being high and one being low) and the output signals Q, QN will be at opposite logic states. Once the data is captured, the NAND gate 221 can cause FB to switch back to the high voltage level, thereby placing the input stage 210 in the data hold mode.

In the output stage 230, the output signal paths 231.1, 231.2 are connected to the data capture nodes 215.1, 215.2. When in the standby mode (i.e., when CLK is at the low voltage level and the CLK-controlled second pull-down transistors 234.1, 234.2 are all turned off), the second transistor chains 234.1, 234.2 have essentially no impact in the output signals Q, QN. When in the output signal stabilization mode (i.e., when the CLK is at the high voltage level and the CLK-controlled second pull-down transistors are all turned on), the second transistor chains 234.1, 234.2 stabilize the opposite voltage levels on the output signal paths 231.1, 231.2 and, thereby the opposite logic stages of the output signals QN, Q. Specifically, in the output signal stabilization mode, if the voltage level on the output signal path 231.1 is high (when the data input signal is at a logic "1") and the voltage level on the output signal path 231.2 is low, the second pull-up transistor 234.1*a* will turn off and the proximal second pull-down transistor 234.1*b* will turn so that the data hold node 235.1 is pulled down to keep the output signal path 231.2 at a low voltage level and Q high. Additionally, the second pull-up transistor 234.2*a* will turn on and the proximal second pull-down transistor 234.2*b* will turn off so that the data hold node 235.2 is pulled up to keep the output signal path 231.1 at a high voltage level and QN low. Contrarily, if the voltage level on the output signal path 231.1 is low (when the data input signal is at a logic "0") and the voltage level on the output signal path 231.2 is high, the second pull-up transistor 234.1*a* will turn on and the proximal second pull-down transistor 234.1*b* will remain off so that the data hold node 235.1 is pulled up to keep the output signal path 231.2 at a high voltage level. Additionally, the second pull-up transistor 234.2*a* will be off and the proximal second pull-up transistor 234.2*b* will turn so that the data hold node 235.2 is pulled down to keep the output signal path 235.1 at a low voltage level and QN high.

Figure 4:
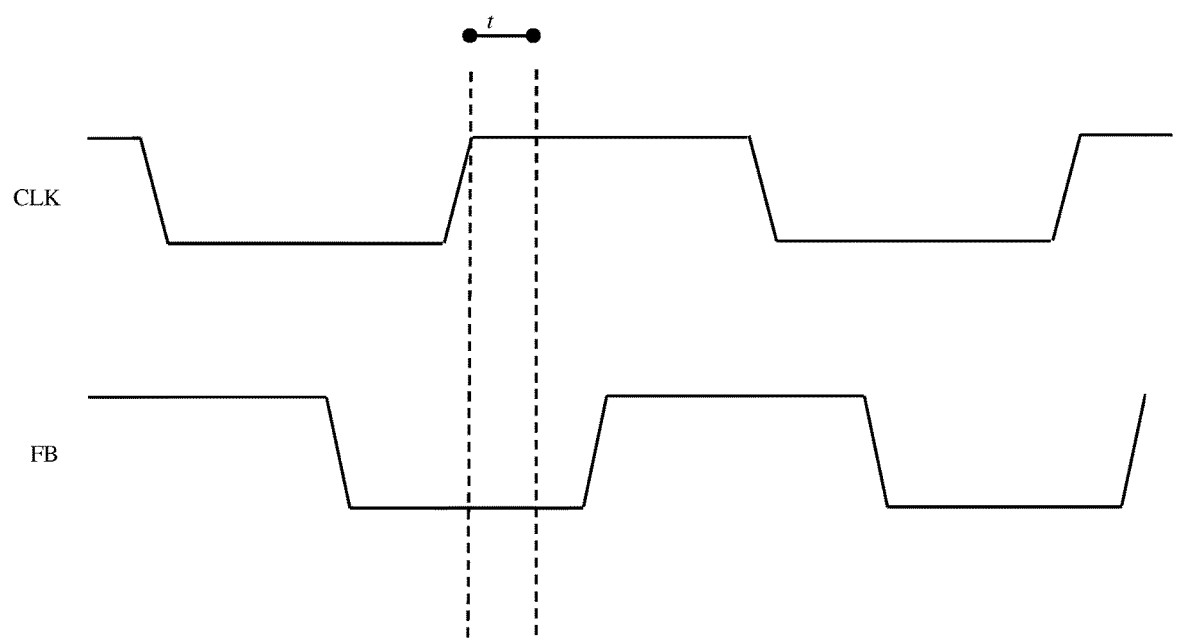
FIG. 4 is a timing diagram associated with either of the dynamic single input-dual output latches of FIGS. 2A and 2B.

However, instead of including an FB-controlled pull-down transistor in each second transistor chain so that this output signal stabilization mode is delayed until after FB switches to the high voltage level (i.e., at the same time the input stage enters the data hold mode), the latch embodiments 200A, 200B disclosed herein are configured so that a first transition time for the input stage to initiate data capture (e.g., by beginning to discharge one of the data capture nodes) following the reset mode and in response to switching of CLK to the high voltage level is less than a second transition time for the output stage to initiate output signal stabilization (e.g., by pulling down one output signal path and pulling up the other) following the standby mode and in response to switching of CLK to the high voltage level This is accomplished by designing the transistor chains so that a first current flow rate through the first pull-down transistors in each first transistor chains in the input stage 210 will be faster than a second current flow rate through the second pull-down transistors (including at least one CLK-controlled second pull-down transistor) in each second transistor chain in the output stage 230. As a result of the different current flow rates, output signal stabilization can be initiated at some point in time after data capture in the input stage 210 has been initiated in response to CLK switching to the high voltage level and this point in time can be before FB subsequently switches to the high voltage level. Thus, in the disclosed latch embodiments 200A, 200B the delay (t) between CLK switching to the high voltage state and initiation of output signal stabilization in the output stage 230 can be reduced, as shown in the timing diagram of FIG. 4, and latch performance can be improved.

The second current flow rate can be reduced relative to the first current flow rate by varying the pull-down transistor sizes and/or by varying the pull-down transistor numbers between the first and second transistor chains.

For example, referring to the latch 200A of FIG. 2A, the first transistor chains 214.1, 214.2 and the second transistor chains 234.1, 234.2 can each have the same number of pull-down transistors (e.g., two). That is, each first transistor chain 214.1, 214.2 can have two first pull-down transistors including the proximal first pull-down transistor 214.1b, 214.2b (which are IS1, IS2-controlled) and the distal first pull-down transistor 214.1c, 214.2c (which are CLK-controlled). Each second transistor chain 234.1, 234.2 can similarly have two second pull-down transistors including the proximal second pull-down transistor 234.1b, 234.2b (which are controlled by the voltage levels on the output signal paths 231.1, 231.2) and the distal second pull-down transistor 234.1c, 234.2c (which are CLK-controlled). The first pull-down transistors 214.1b-c, 214.2b-c in each first transistor chain 214.1, 214.2 can each have a first channel width and the second pull-down transistors 234.1b-c, 234.2b-c in each second transistor chain 234.1, 234.2 can each have a second channel width that is less than the first channel width. Thus, the second pull-down transistors will be weaker than the first pull-down transistors.

More specifically, due to the different channel widths, the first drive strength of the first pull-up transistors 214.1b-c, 214.2b-c will be greater than the second drive strength of the second pull-down transistors 234.1b-c, 234.2b-c. Thus, in response to CLK switching to high voltage level, the input stage 210 will transition from the reset mode to the data capture mode and all of the first pull-down transistors in one of the first transistor chains (i.e., in 214.1 or in 214.2 depending upon the data value of D) will be turned on to discharge one of the data capture nodes (i.e., 215.1 or 215.2, respectively). Additionally, in response to CLK switching to high voltage level, the output stage 230 will transition from the standby mode to the output signal stabilization mode and all of the second pull-down transistors in one of the second transistor chains (i.e., in 234.1 or 234.2) will be turned on to pull down the voltage level on one of the output signal paths (i.e., on 231.2 or 231.1, respectively). However, because of the greater first drive strength of the first pull-down transistors as compared to the second drive strength of the second pull-down transistors, the first current flow rate through the first pull-down transistors will be faster than the second current flow rate through the second pull-down transistors. As a result, in response to CLK switching to the high voltage level, data capture in the input stage 210 will be initiated (by discharging of the voltage on one of the data capture nodes through one of the first transistor chains) and at some later point in time output signal stabilization will be initiated (by pulling down the voltage level on one output signal path through one of the second transistor chains) in the output stage 230. This later point in time can be before FB subsequently switches to the high voltage level. Thus, the latch 200A provides for improved performance over the latch 100. Additionally, since the latch 200A requires a lesser number of pull-down transistors in the output stage 230, overall latch size can also be reduced.

In another embodiment, referring to the latch 200B of FIG. 2B, the first transistor chains 214.1, 214.2 and the second transistor chains 234.1, 234.2 can have different numbers of pull-down transistors. More specifically, the first transistor chains can each have a first number (e.g., one or more) of CLK-controlled first pull-down transistors and the second transistor chains can each have a second number (e.g., two or more) of CLK-controlled second pull-down, wherein the second number is less than the first. For example, each first transistor chain 214.1, 214.2 can have two first pull-down transistors including the proximal first pull-down transistor 214.1b, 214.2b (which are IS1, IS2-controlled) and the distal first pull-down transistor 214.1c, 214.2c (which are CLK-controlled). Each second transistor chain 234.1, 234.2 can have three second pull-down transistors including the proximal second pull-down transistor 234.1b, 234.2b (which are controlled by the voltage levels on the output signal paths 231.1, 231.2) and the center and distal second pull-down transistors 234.1c-d, 234.2c-d (which are CLK-controlled). Thus, the second pull-up transistors will be weaker than the first pull-up transistors.

More specifically, even though CLK is concurrently applied to gates of pull-down transistors in both the first transistor chains and the second transistor chains, when CLK switches to the high voltage state the pull-down transistors in a given chain will turn on in sequence starting with the most distal. That is, when CLK switches to the high voltage level it is concurrently applied to the gates of the first pull-down transistor 214.1c, 214.2c in each first transistor chain 214.1, 214.2 and to the gates of the second pull-down transistors 234.1c-d, 234.2c-d in each second transistor chain 234.1, 234.2. As a result, the first pull-down transistor 214.1c, 214.2c in each first transistor chain 214.1, 214.2 and the distal second pull-down transistors 234.1d, 234.2d in each second transistor chain 234.1, 234.2 will concurrently turn on. However, the second pull-down transistor 234.1c, 234.2c will be in the sub-threshold range until after the second pull-down transistor 234.1d, 234.2d have turned on. Because of the lesser first number of the CLK-controlled first pull-down transistors in each first transistor chain as compared to the second number of CLK-controlled second pull-down transistors in each second transistor chain, the first current flow rate through the first pull-down transistors will be faster than the second current flow rate through the second pull-down transistors. Thus, in response to CLK switching to the high voltage level, data capture in the input stage 210 will be initiated (by discharging of the voltage on one of the data capture nodes) and at some later point in time output signal stabilization will be initiated (by pulling down the voltage level on one output signal path through one of the second transistor chains and pulling up the voltage level on the other) in the output stage 230. This later point in time can be before FB subsequently switches to the high voltage level. Thus, the latch 200B also provides for improved performance over the latch 100.

In yet another embodiment, a combination of different channel widths and different numbers of CLK-controlled pull-down transistors in the first and second transistor chains could be employed in essentially the same manner as described in detail above with regard to the latch embodiments 200A and 200B.

Those skilled in the art will recognize that in each of the above-described latch embodiments the optimal different channel widths between the pull-up transistors in the input and output stages and/or the optimal different numbers of CLK-controlled pull-up transistors in the input and output stages to achieve the desired delay between switching of CLK to the high voltage level and initiation of output signal stabilization in the output stage can be predetermined through simulation.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A latch comprising:
    an input stage comprising first transistor chains, wherein each first transistor chain comprises a capture node and wherein operation of the input stage is dependent on a clock signal and a feedback signal;
    a feedback stage comprising a logic gate connected to capture nodes of the first transistor chains, respectively, and outputting the feedback signal; and
    an output stage comprising:
        output signal paths connected to the capture nodes, respectively; and
        second transistor chains,
            wherein the second transistor chains are cross-coupled between the output signal paths,
            wherein each second transistor chain comprises: a second pull-up transistor; a proximal second pull-down transistor; a hold node at a junction between the second pull-up transistor and the proximal second pull-down transistor; and at least one distal second pull-down transistor connected in series with the proximal second pull-down transistor,
            wherein each distal second pull-down transistor is clock-controlled, and
            wherein operation of the output stage is dependent on the clock signal and independent of the feedback signal.

2. The latch of claim 1,
    wherein the input stage operates in any of a reset mode, a capture mode and a hold mode, and
    wherein the output stage operates in any of a standby mode and an output signal stabilization mode.

3. The latch of claim 2,
    wherein each first transistor chain comprises: a first pull-up transistor; first pull-down transistors; and the capture node at a junction between the first pull-up transistor and the first pull-down transistors,
    wherein the logic gate comprises a NAND gate,
    wherein, when the feedback signal is at a high voltage level and the clock signal switches to a low voltage level, the input stage enters the reset mode and pre-charges the capture nodes,
    wherein, when the capture nodes are pre-charged to the high voltage level, the logic gate switches the feedback signal to the low voltage level,
    wherein, when the feedback signal is at the low voltage level and the clock signal switches to the high voltage level, the input stage enters the capture mode and, based on a data input signal, discharges one capture node to the low voltage level so that the capture nodes are at different voltage levels, and
    wherein, when the capture nodes are at the different voltage levels, the logic gate switches the feedback signal to the high voltage level and the input stage enters a hold mode to prevent further switching of the different voltage levels on the capture nodes.

4. The latch of claim 3,
    wherein, when the feedback signal is at the low voltage level and the clock signal switches to the high voltage level, a first current flow rate in the input stage is faster than a second current flow rate in the output stage so that transition of the output stage from the standby mode to the output signal stabilization mode is delayed until the one capture node begins discharging, and
    wherein, when the output stage is in the output signal stabilization mode, the output stage maintains the different voltage levels on the output signal paths.

5. The latch of claim 3,
    wherein, in each of the first transistor chains, the first pull-down transistors comprise a distal first pull-down transistor and a proximal first pull-down transistor connected in series between the first pull-up transistor and the distal first pull-down transistor,
    wherein, in each of the first transistor chains, gates of the first pull-up transistor and the distal first pull-down transistor receive the clock signal, and
    wherein the input stage further comprises:
        a data input node receiving the data input signal;
        a first NOR gate receiving the data input signal and the feedback signal and outputting a first intermediate signal, wherein a gate of the proximal first pull-down transistor in a first one of the first transistor chains receives the first intermediate signal;
        an inverter receiving the data input signal and outputting an inverted data input signal; and
        a second NOR gate receiving the inverted data input signal and the feedback signal and outputting a second intermediate signal, wherein a gate of the proximal first pull-down transistor of a second one of the first transistor chains receives the second intermediate signal.

6. The latch of claim 3,
    wherein, in a first one of the second transistor chains, gates of the second pull-up transistor and the proximal second pull-down transistor are connected to a first one of the output signal paths and the hold node is connected to a second one of the output signal paths, and wherein, in a second one of the second transistor chains, gates of the second pull-up transistor and the proximal second pull-down transistor are connected to the second one of the output signal paths and the hold node is connected to the first one of the output signal paths.

7. The latch of claim 6, wherein all gates of all distal second pull-down transistors in the second transistor chains are connected to the clock signal.

8. A latch comprising:

an input stage comprising first transistor chains, wherein each first transistor chain comprises: a first pull-up transistor; two first pull-down transistors, each first pull-down transistor having a first channel width; and a capture node at a junction between the first pull-up transistor and the first pull-down transistors and wherein operation of the input stage is dependent on a clock signal and a feedback signal;

a feedback stage comprising a logic gate connected to capture nodes of the first transistor chains, respectively, and outputting the feedback signal; and an output stage comprising:

output signal paths connected to the capture nodes, respectively; and second transistor chains, wherein each second transistor chain comprises: a second pull-up transistor; three second pull-down transistors, each second pull-down transistor of the three second pull-down transistors having a second channel width that is less than the first channel width and two second pull-down transistors of the three second pull-down transistors being clock-controlled; and a hold node at a junction between the second pull-up transistor and the second pull-down transistors, wherein the second transistor chains are cross-coupled between the output signal paths, and wherein operation of the output stage is dependent on the clock signal and independent of the feedback signal.

9. The latch of claim 8, wherein the input stage operates in any of a reset mode, a capture mode and a hold mode, and wherein the output stage operates in any of a standby mode and an output signal stabilization mode.

10. The latch of claim 9, wherein the logic gate comprises a NAND gate, wherein, when the feedback signal is at a high voltage level and the clock signal switches to a low voltage level, the input stage enters the reset mode and pre-charges the capture nodes, wherein, when the capture nodes are pre-charged to the high voltage level, the logic gate switches the feedback signal to the low voltage level, wherein, when the feedback signal is at the low voltage level and the clock signal switches to the high voltage level, the input stage enters the capture mode and, based on a data input signal, discharges one capture node to the low voltage level so that the capture nodes are at different voltage levels, and wherein, when the capture nodes are at the different voltage levels, the logic gate switches the feedback signal to the high voltage level and the input stage enters a hold mode to prevent further switching of the different voltage levels on the capture nodes.

11. The latch of claim 10, wherein, due to a difference between the first channel width and the second channel width, when the feedback signal is at the low voltage level and the clock signal switches to the high voltage level, a first current flow rate in the input stage is faster than a second current flow rate in the output stage so that transition of the output stage from the standby mode to the output signal stabilization mode is delayed until the one capture node begins discharging, and wherein, when the output stage is in the output signal stabilization mode, the output stage maintains the different voltage levels on the output signal paths.

12. The latch of claim 10, wherein, in each of the first transistor chains, the first pull-down transistors comprise a distal first pull-down transistor and a proximal first pull-down transistor connected in series between the first pull-up transistor and the distal first pull-down transistor, wherein, in each of the first transistor chains, gates of the first pull-up transistor and the distal first pull-down transistor receive the clock signal, and wherein the input stage further comprises:

a data input node receiving the data input signal;

a first NOR gate receiving the data input signal and the feedback signal and outputting a first intermediate signal, wherein a gate of the proximal first pull-down transistor in a first one of the first transistor chains receives the first intermediate signal;

an inverter receiving the data input signal and outputting an inverted data input signal; and a second NOR gate receiving the inverted data input signal and the feedback signal and outputting a second intermediate signal, wherein a gate of the proximal first pull-down transistor of a second one of the first transistor chains receives the second intermediate signal.

13. The latch of claim 8, wherein, in each of the second transistor chains, the second pull-down transistors comprise distal second pull-down transistors and a proximal second pull-down transistor connected in series between the second pull-up transistor and the distal second pull-down transistors, wherein, in a first one of the second transistor chains, gates of the second pull-up transistor and the proximal second pull-down transistor are connected to a first one of the output signal paths and the hold node is connected to a second one of the output signal paths, and wherein, in a second one of the second transistor chains, gates of the second pull-up transistor and the proximal second pull-down transistor are connected to the second one of the output signal paths and the hold node is connected to the first one of the output signal paths.

14. The latch of claim 13, wherein all gates of all distal second pull-down transistors in the second transistor chains are connected to the clock signal.

15. A latch comprising:

an input stage comprising first transistor chains, wherein each first transistor chain comprises: a first pull-up transistor; first pull-down transistors; and a capture node at a junction between the first pull-up transistor and the first pull-down transistors and wherein operation of the input stage is dependent on a clock signal and a feedback signal;

a feedback stage comprising a logic gate connected to capture nodes of the first transistor chains, respectively, and outputting the feedback signal; and an output stage comprising:
   output signal paths connected to the capture nodes, respectively; and
   second transistor chains, wherein each second transistor chain comprises: a second pull-up transistor; second pull-down transistors; and a hold node at a junction between the second pull-up transistor and the second pull-down transistors, wherein a first number of clock-controlled pull-down transistors in each first transistor chain is less than a second number of clock-controlled pull-down transistors in each second transistor chain, wherein the second transistor chains are cross-coupled between the output signal paths, and wherein operation of the output stage is dependent on the clock signal and independent of the feedback signal.

16. The latch of claim 15,
wherein the input stage operates in any of a reset mode, a capture mode and a hold mode, and
wherein the output stage operates in any of a standby mode and an output signal stabilization mode.

17. The latch of claim 16,
wherein the logic gate comprises a NAND gate,
wherein, when the feedback signal is at a high voltage level and the clock signal switches to a low voltage level, the input stage enters the reset mode and pre-charges the capture nodes,
wherein, when the capture nodes are pre-charged to the high voltage level, the logic gate switches the feedback signal to the low voltage level,
wherein, when the feedback signal is at the low voltage level and the clock signal switches to the high voltage level, the input stage enters the capture mode and, based on a data input signal, discharges one capture node to the low voltage level so that the capture nodes are at different voltage levels, and
wherein, when the capture nodes are at the different voltage levels, the logic gate switches the feedback signal to the high voltage level and the input stage enters a hold mode to prevent further switching of the different voltage levels on the capture nodes.

18. The latch of claim 17,
wherein, because the first number is less than the second number, when the feedback signal is at the low voltage level and the clock signal switches to the high voltage level, a first current flow rate in the input stage is faster than a second current flow rate in the output stage so that transition of the output stage from the standby mode to the output signal stabilization mode is delayed until the one capture node begins discharging, and wherein, when the output stage is in the output signal stabilization mode, the output stage maintains the different voltage levels on the output signal paths.

19. The latch of claim 17,
wherein, in each of the first transistor chains, the first pull-down transistors comprise a distal first pull-down transistor and a proximal first pull-down transistor connected in series between the first pull-up transistor and the distal first pull-down transistor,
wherein, in each of the first transistor chains, gates of the first pull-up transistor and the distal first pull-down transistor receive the clock signal, and
wherein the input stage further comprises:
   a data input node receiving the data input signal;
   a first NOR gate receiving the data input signal and the feedback signal and outputting a first intermediate signal, wherein a gate of the proximal first pull-down transistor in a first one of the first transistor chains receives the first intermediate signal;
   an inverter receiving the data input signal and outputting an inverted data input signal; and
   a second NOR gate receiving the inverted data input signal and the feedback signal and outputting a second intermediate signal, wherein a gate of the proximal first pull-down transistor of a second one of the first transistor chains receives the second intermediate signal.

20. The latch of claim 15,
wherein, in each of the second transistor chains, the second pull-down transistors comprise at least two distal second pull-down transistors and a proximal second pull-down transistor connected in series between the second pull-up transistor and the at least two distal second pull-down transistors,
wherein, in a first one of the second transistor chains, gates of the second pull-up transistor and the proximal second pull-down transistor are connected to a first one of the output signal paths and the hold node is connected to a second one of the output signal paths, and
wherein, in a second one of the second transistor chains, gates of the second pull-up transistor and the proximal second pull-down transistor are connected to the second one of the output signal paths and the hold node is connected to the first one of the output signal paths, and
wherein all gates of all distal second pull-down transistors in the second transistor chains are connected to the clock signal.

* * * * *